WITNESSES
Theodore F. Wrobel
James F. Young

INVENTORS
Charles F. Cromer, Albert P. Strom
& Thomas E. Browne, Jr.
BY
Willard R. Crout
ATTORNEY 3,381,101

CROSS-BLAST CIRCUIT BREAKERS WITH POSITIVE COORDINATION BETWEEN CONTACT MEMBERS AND PUFFER STRUCTURE

Albert P. Strom, Forest Hills, Charles F. Cromer, Penn Township, and Thomas E. Browne, Jr., Forest Hills, Pa., assignors to Westinghouse Electric Corporation, Pittsburgh, Pa., a corporation of Pennsylvania Filed Jan. 15, 1965, Ser. No. 425,724
5 Claims. (Cl. 200—148)

ABSTRACT OF THE DISCLOSURE

A puffer-type compressed-gas circuit interrupter has a cross-blast splitter-type arc chute disposed within a grounded tank, and has a positive mechanical connection between the operating means for the separable contact structure and the piston structure for the puffer device. A resistor connected to a probe within the arc chute assists in circuit interruption.

This invention relates, generally, to circuit breakers and, more particularly, to circuit breakers of the cross-blast gas-filled type.

Cross-blast gas-filled circuit breakers have been shown to be effective circuit interrupters, particularly for high current and relatively low voltage service, for example, in the range of 13.8 kv. to 34.5 kv. A double pressure system might be used to obtain the differential pressure necessary to operate a cross-blast circuit breaker of the enclosed gas-filled type. However, the cost of such a system is too high, particularly for breakers in the class of 13.8 kv. to 34.5 kv., because a compressor must be supplied and a heating system must be provided to prevent condensation.

An object of this invention is to overcome the foregoing difficulties by producing the gas flow for a cross-blast breaker by means of a puffer which creates a differential pressure within the breaker tank during the opening operation.

Another object of the invention is to coordinate the contact operation with the movement of the puffer in a circuit breaker.

A further object of the invention is to provide a puffer and arc splitters in a completely enclosed pressurized circuit breaker.

Still another object of the invention is to provide for introducing a shunting resistor into the circuit during the interruption of an arc, and subsequently interrupting the resistor current.

A still further object of the invention is to reduce the number of seals required for the operating mechanism of an enclosed pressurized circuit breaker.

Another object of the invention is to provide fluid pressure means for operating the puffer and the movable contact member of a circuit breaker.

A further object of the invention is to connect directly a puffer piston and a movable contact member in an enclosed circuit breaker.

Other objects of the invention will be explained fully hereinafter or will be apparent to those skilled in the art.

In accordance with one embodiment of the invention, a splitter-type cross-blast interrupter is enclosed in a chamber containing sulfur hexafluoride or other interrupting gas. The gas flow for the cross blast is produced by a puffer piston driven in a cylinder by a spring which is compressed by the operating mechanism during its closing stroke. The contact operation is coordinated with the puffer motion through levers and links. The arc is drawn by the moving contact at the bottom of an arc box containing a plurality of splitters and interrupted by a transverse gas blast entering through a blast tube connecting the bottom of the box with the puffer cylinder. A shunting resistor is introduced in series with the circuit by means of a probe mounted on one of the splitters in such a way that at least one splitter is available to interrupt the resistor-limited probe current.

For a better understanding of the nature and objects of the invention, reference may be had to the following detailed description taken in conjunction with the accompanying drawing, in which.

Figure 1:
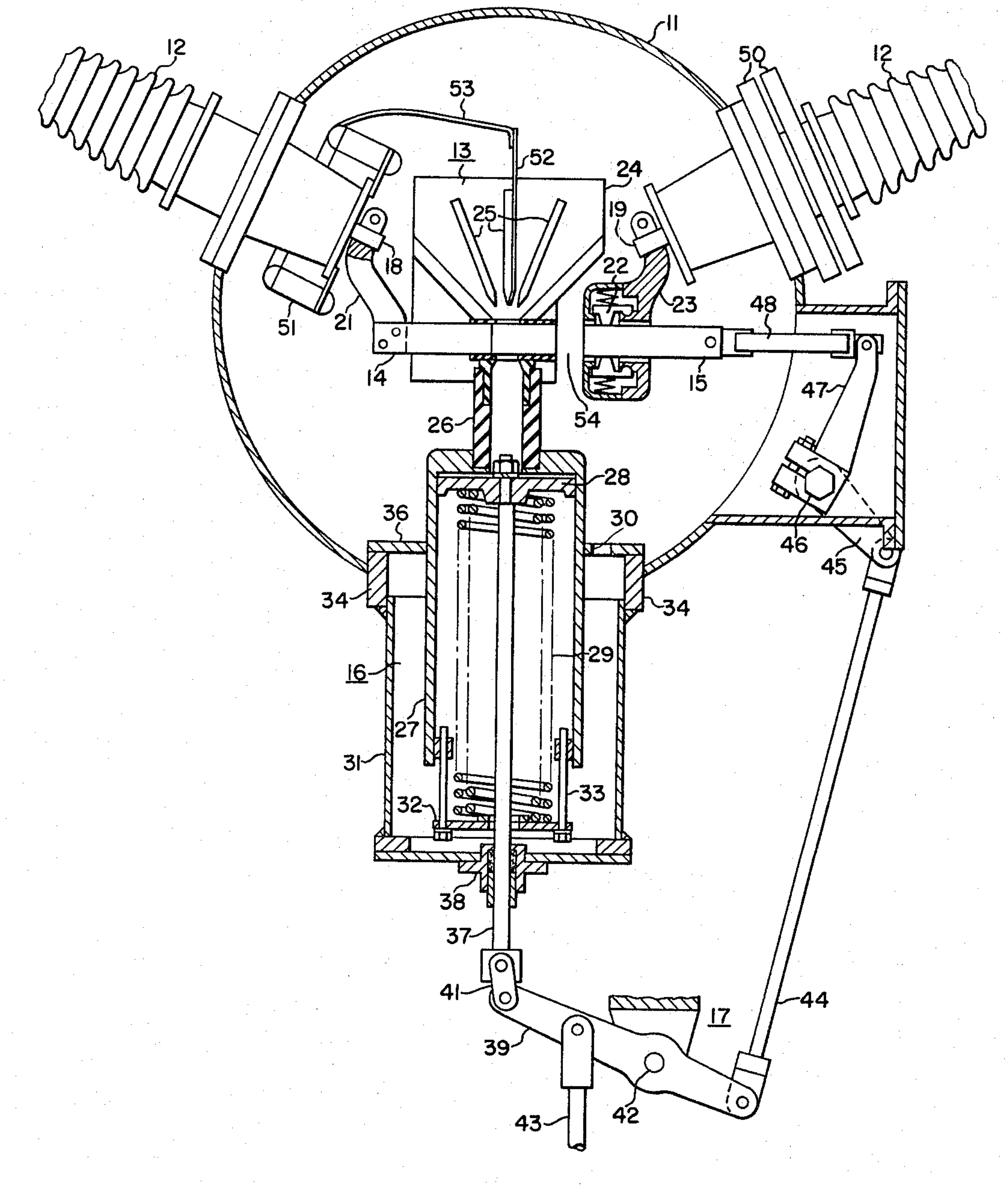
FIGURE 1 is a view, partly in elevation and partly in section, of a circuit breaker embodying principal features of the invention.

Referring to the drawing, and particularly to FIG. 1, one pole of a three-phase breaker is shown therein. In a three-phase breaker all three interrupters may be mounted in a single tank, with contact mechanisms mechanically operated in parallel, or three separate single-phase breakers may be utilized. Three puffers may be provided, also operated mechanically in parallel. However, if desired, a single puffer of somewhat larger size may be used to supply all the interrupters in a three-phase breaker.

The structure in FIG. 1 comprises a metal tank or chamber 11, two insulating bushings 12, an interrupter 13, a fixed contact member 14, a movable contact member 15, a puffer assembly 16, and a mechanical operating mechanism 17. The chamber 11 is filled with an interrupting gas, preferably one of the electro-negative gases such as sulfur hexafluoride which will be hereinafter referred to as $SF_6$. The gas may be introduced into the chamber through a suitable valve (not shown) and is preferably maintained at a pressure above atmospheric pressure. Under certain conditions, the gas in chamber 11 may be below atmospheric pressure. The bushings 12 may be of a type well known in the art.

A power conductor 18 enters the chamber 11 through one of the bushings 12. A similar power conductor 19 enters the chamber through the other bushing 12. The power conductors 18 and 19 may be provided with suitable terminals for connecting them to line conductors. The fixed contact member 14 is connected to the conductor 18 by means of a conductor 21. A cluster of contact fingers 22 surrounds the movable contact member 15. The contact fingers 22 are spring biased into engagement with the contact member 15 and the cluster assembly is connected to the conductor 19 by a conductor 23.

The interrupter 13 is of a splitter cross-blast type. It comprises an arc box 24 containing a plurality of splitter plates 25. The arc box is preferably lined with polytetrafluoroethylene which is sold under the trade name "Teflon." The splitter plates 25 are also composed of "Teflon." The contact members 14 and 15 are mounted at the bottom of the arc box below the splitter plates 25.

The interrupter unit 13 is mounted on an insulating tube 26. The tube 26 also serves to conduct a blast of the $SF_6$ gas, which is compressed by the puffer assembly 16, into the bottom of the interrupter. The tube 26 is mounted on the puffer assembly 16.

The puffer assembly 16 comprises a cylinder 27, a piston 28 and compression springs 29 disposed inside the cylinder 27. The cylinder 27 is mounted inside an extension compartment 31 of the chamber 11. The piston 28 is driven upwardly by the springs 29 which are compressed when the movable contact member 15 is closed to engage the fixed contact member 14. The compression of the springs 29 may be varied by means of a spring adjustment member 32 which is adjustably attached to the cylinder 27 by bolts 33. The puffer assembly 16 is mounted on supports 34 in the chamber 11 by bolts 35 which extend through a bracket or flange 36 secured to the cylinder 27 by welding or other suitable means. An opening 30 is provided in the flange 36 to permit the $SF_6$ gas to flow between the chamber 11 and the compartment 31.

The movement of the piston 28 and the movable contact member 15 is coordinated by the operating mechanism 17. A piston rod 37 extends through the bottom of the extension compartment 31 of the chamber 11. A seal 38 surrounds the piston rod 37 to retain the $SF_6$ gas in the chamber. The lower end of the piston rod 37 is connected to a main operating lever 39 by a link 41. The lever 39 is pivoted at 42 and is actuated through a link 43 which is connected to the breaker operating mechanism (not shown).

A vertical operating link 44 is also connected at its lower end to the lever 39 and at its upper end to an operating lever 45. The lever 45 is connected to a shaft 46 which enters the chamber 11 through a gland seal. Within the chamber 11 a contact operating lever 47 is also connected to the shaft 46. The upper end of the lever 47 is attached to an insulating rod 48 which is attached to the movable contact member 15. A horizontal motion of the contact member 15 is effected by rotation of the shaft 46.

As explained hereinbefore, the piston 28 is lowered in the cylinder 27 to compress the springs 29 during the closing movement of the movable contact member 15. Thus, when the tripping mechanism of the breaker is actuated, the springs 29 drive the piston 28 upwardly and at the same time separate the movable contact member 15 from the fixed contact member 14. An arc is drawn between the contact members at the bottom of the arc box 24. The piston 28 compresses the $SF_6$ gas in the cylinder 27 to produce a gas blast through the tube 26 into the bottom of the arc box. The transverse gas blast blows the arc laterally against the splitter plates 25, thereby interrupting the arc.

In order to assist in the interruption of the arc, a shunting resistor 51 may be mounted on the lower end of one insulating bushing 12. One terminal of the resistor 51 is connected to the conductor 18 which, in turn, is connected to the fixed contact member 14 by the conductor 21, and the other terminal of the resistor 51 is connected to the upper end of a probe 52 by means of a conductor 53. The probe 52 is so mounted on the middle splitter plate 25 that its lower end is in the arc stream between the contact members. Thus, the portion of the arc between the probe 52 and the fixed contact member 14 is shunted by the resistor 51, and this portion of the arc is easily interrupted because of the low rate of rise of recovery voltage caused by the shunting resistor.

After the one portion of the arc is interrupted, the resistor 51 is introduced in series with the circuit and limits the current to a small value. Then the portion of the arc between the probe and the moving contact member is interrupted at the next current zero. At least one splitter plate is available to assist in interrupting the resistor limited probe current. At its full open position the contact member 15 leaves an isolating gap 54 to the interrupter and the fixed contact member 14. In this manner it is possible for the breaker to withstand higher open circuit voltage. The tank 11 may be grounded, thereby making it possible to utilize relatively inexpensive current transformers of the bushing type which are shown at 50 on the bushing 12 through which the conductor 19 extends.

The probe 52 located on one of the splitter plates 25 provides a simple way of introducing the shunting resistor. With the resistor shunt, the rate of rise of recovery voltage is reduced to a low value, thereby making possible the interruption of much higher currents. High rates of rise due to line faults are also no problem. The resistor 51 may be mounted inside the tank, as shown in FIG. 1, or it may be mounted externally of the tank as shown in FIG. 5.

Figure 2:
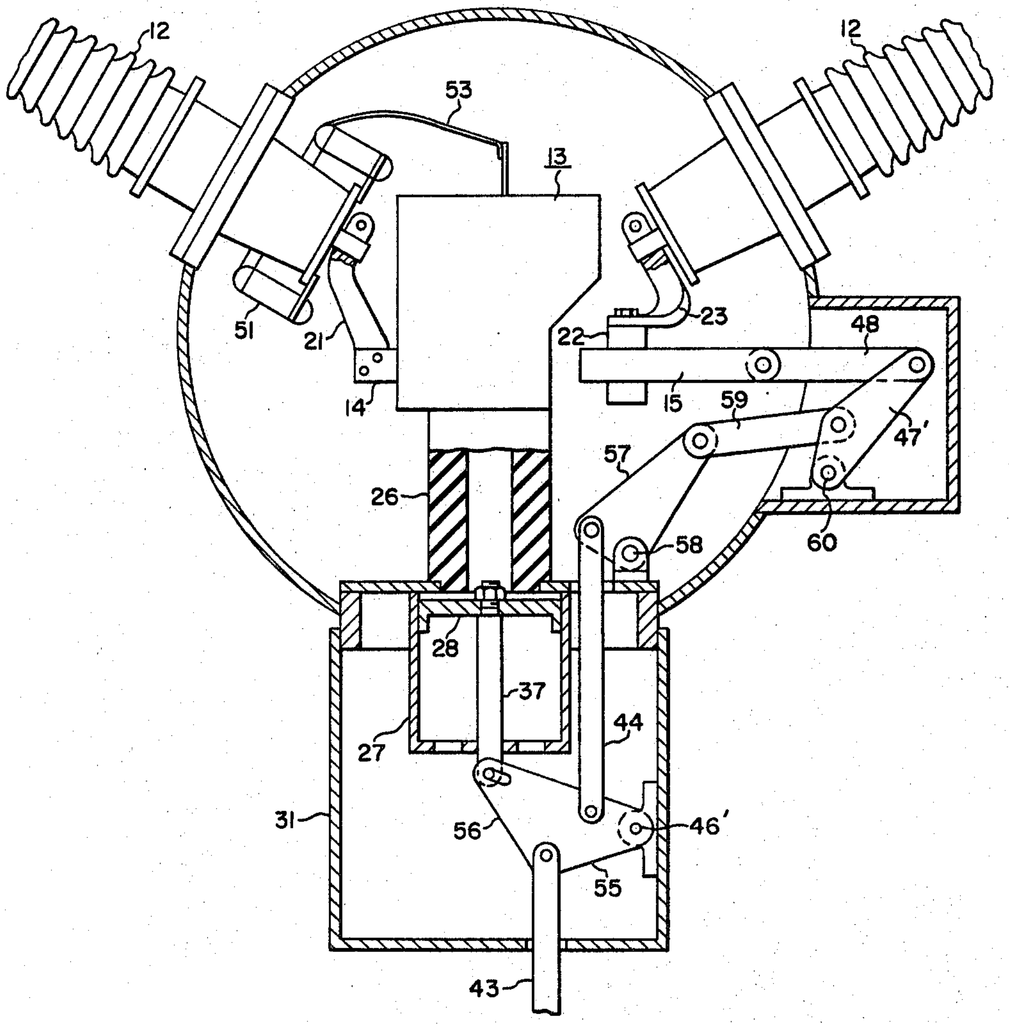
FIGS. 2 and 3 are somewhat diagrammatic views of modifications of the structure shown in FIG. 1.

The structure shown in FIG. 2 is similar to FIG. 1, except that in this case the piston rod for the puffer is not brought out through a seal in the tank to the operating mechanism. All of the actuating mechanism for the puffer and the movable contact member is mounted internally of the chamber 11 except a main operating lever 55 and the link 43 which is connected to the breaker operating mechanism. The lever 55 is connected to the shaft 46′ which enters the compartment 31 of the chamber 11 through a gland seal. This is the only seal required for a moving part. The shaft 46′ is connected to the piston rod 37 by a lever 56. The lever 56 is also connected to one arm of a bell crank lever 57 by the vertical link 44. The bell crank 57 is pivoted at 58 and its other arm is connected to the lever 47′ by a link 59. One end of the lever 47 is pivoted at 60 and the other end is connected to the insulating rod 48 which is connected to the moving contact member 15 as explained hereinbefore. It should be noted that the springs (not shown) for operating the puffer and contacts are externally located and associated with the operating link 43.

Figure 3:
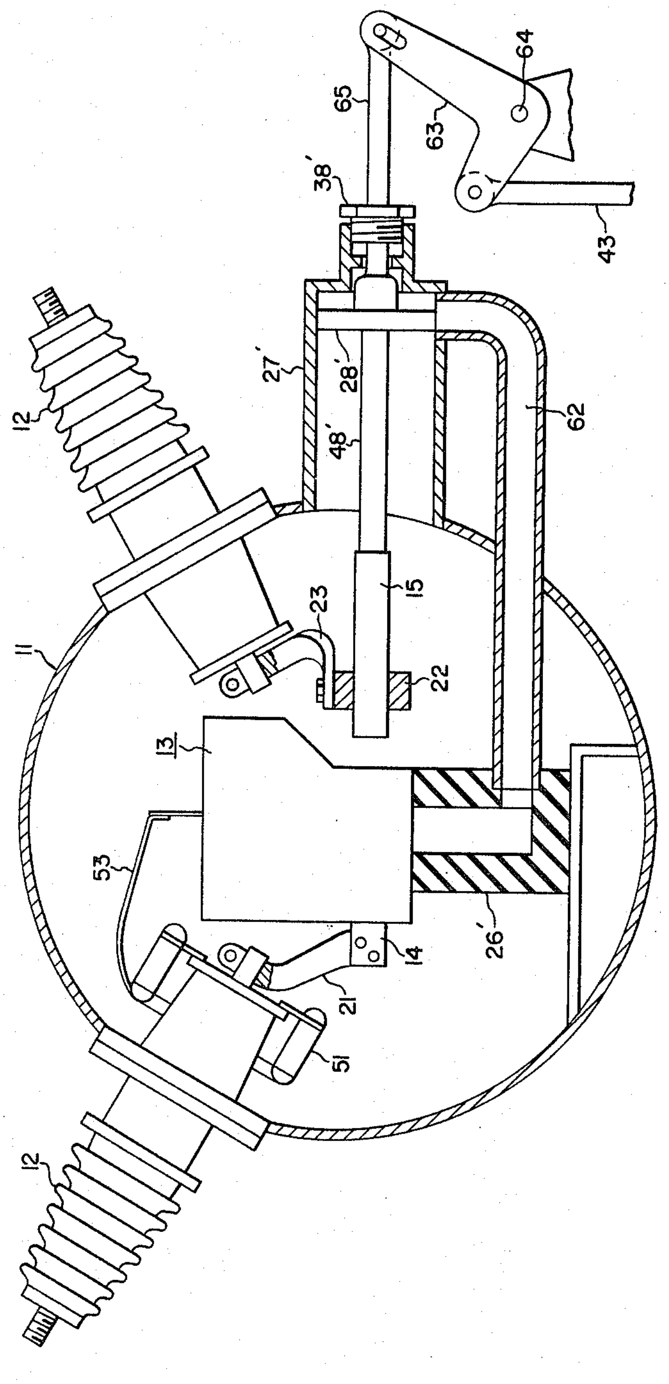

Still another arrangement is shown in FIG. 3. In this case the puffer piston 28′ and the moving contact 15 are directly connected by an insulating member 48′ so that both move together in the same direction. In this construction the puffer piston is pulled rather than pushed and the discharge of the gas is at the back of the puffer cylinder 27′. The gas is conducted by a conduit 62 along side the cylinder into the blast tube 26′ and thence into the interrupter 13. The conduit 62 may be welded into the pressure chamber 11, and extends to the hollow insulating support 26′. The link 43 from the breaker operating mechanism is connected to one arm of a bell crank lever 63 which is pivoted at 64. The other arm of the lever 63 is connected to a rod 65 which extends into the cylinder 27′ through a seal 38′. The rod 65 may be threaded onto the end of the insulating member 48′, thereby actuating the piston 28′ and the moving contact member 15. The other parts in the structure shown in FIG. 3 are similar to those shown in FIG. 1 and have been given the same reference numerals.

Figure 4:
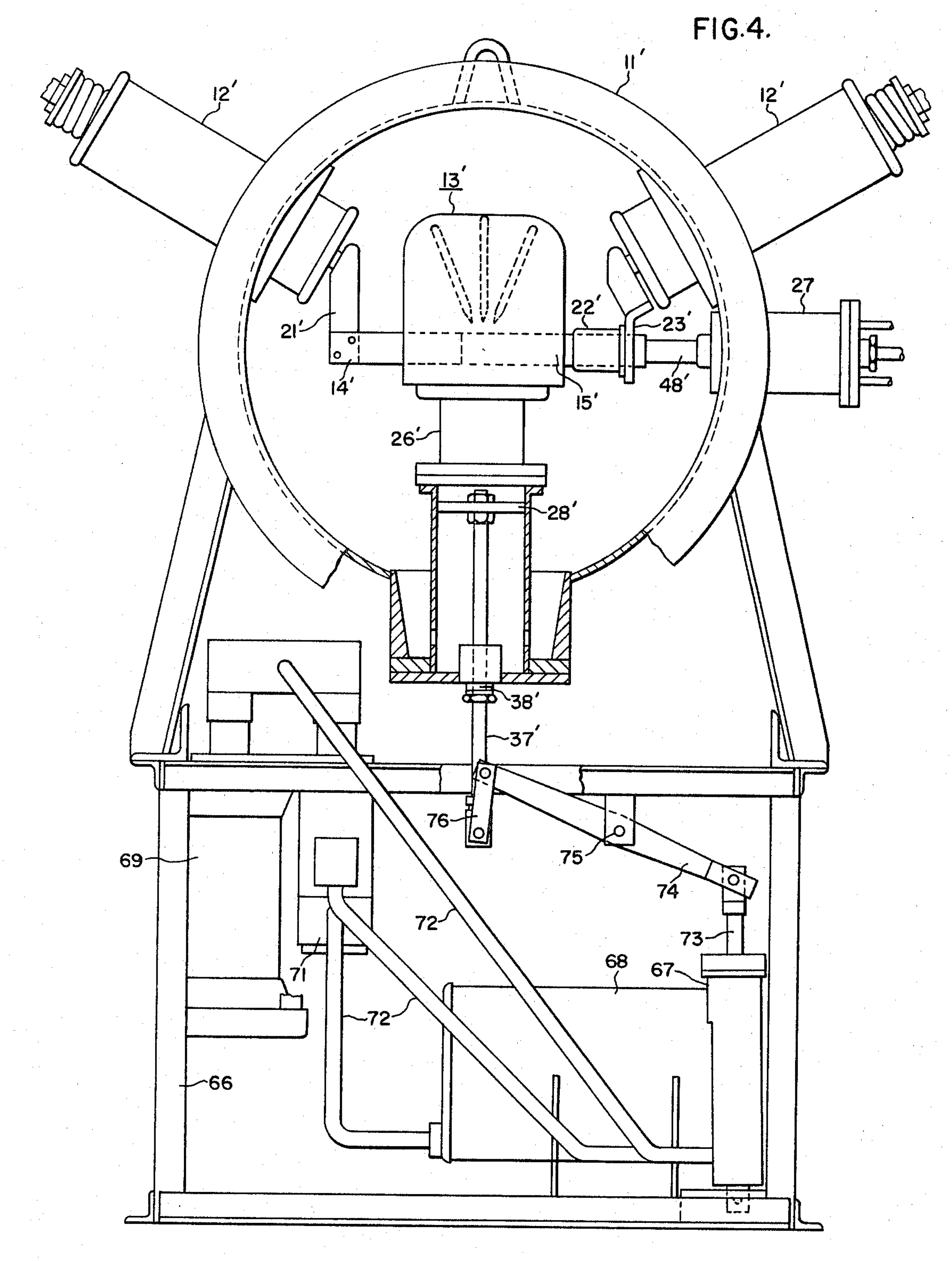
FIG. 4 is a view, partly in front elevation and partly in section, of a modified circuit breaker.
Figure 5:
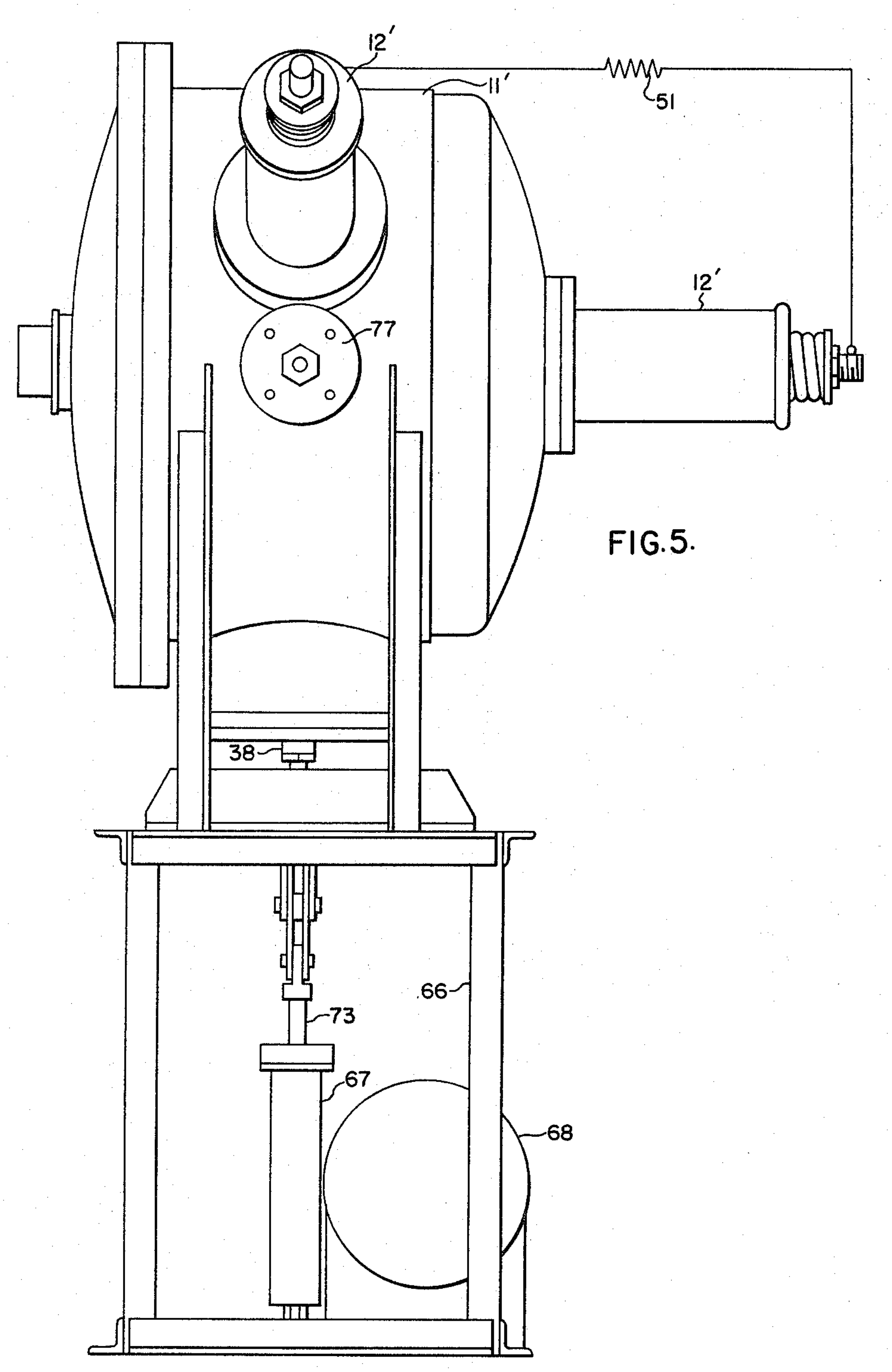
FIG. 5 is a view, in end elevation of the breaker shown in FIG. 4.

FIGS. 4 to 11, inclusive, are views of a circuit breaker built and tested in the laboratory of applicants' assignee. In these views certain parts of the circuit breaker are shown in more detail than in FIGS. 1 to 3, inclusive. These parts perform the same basic functions as in the breaker shown in FIGS. 1 to 3. The principal difference between the two breakers is in the manner of operating the puffer and the movable contact member. In this case the puffer piston is actuated hydraulically and the movable contact member is actuated pneumatically as will be described more fully hereinafter. Also, as previously mentioned, the shunting resistor 51 is mounted externally of the breaker tank and is connected to the probe by the conductor 53′ inside the tank through a third bushing 12′ as shown in FIG. 5.

As shown in FIG. 4, the breaker tank 11′ is supported on a framework 66. The framework 66 may be of the usual construction and will not be described in detail. The framework 66 also supports the hydraulic mechanism for operating the puffer piston 28'. The hydraulic mechanism comprises a cylinder 67 inside of which is disposed a piston, a sump 68, an accumulator 69, a valve mechanism 71, a pump (not shown) and suitable plumbing connections indicated by the reference numeral 72. A piston rod 73 from the cylinder 67 is connected to a lever 74 which is pivoted on the framework 66 at 75. The other end of the lever 74 is connected to the lower end of the piston rod 37' by a link 76. As previously explained, the piston rod 37' is connected to the puffer piston 28' inside the puffer cylinder 27'. The operation of the puffer piston is controlled by the valve mechanism 71 which controls the flow of the hydraulic fluid under pressure to the cylinder 67. The fluid is removed from the sump 68 by the pump and returned to the accumulator 69 under pressure. The operation of the valve mechanism 71 may be controlled in any suitable manner.

The pneumatic mechanism for operating the movable contact member 15 comprises a cylinder 77 inside of which is disposed a piston which is connected to the moving contact member 15 by the insulating rod 48'. The cylinder 77 may be connected to a source of compressed air through a suitable valve mechanism (not shown). The operation of the valve mechanism may be controlled in any suitable manner and the coordination of the movement of the puffer piston and the movable contact member may be controlled by means of the valve mechanisms which, in turn, control the operation of the hydraulic and the pneumatic mechanisms.

Figure 7:
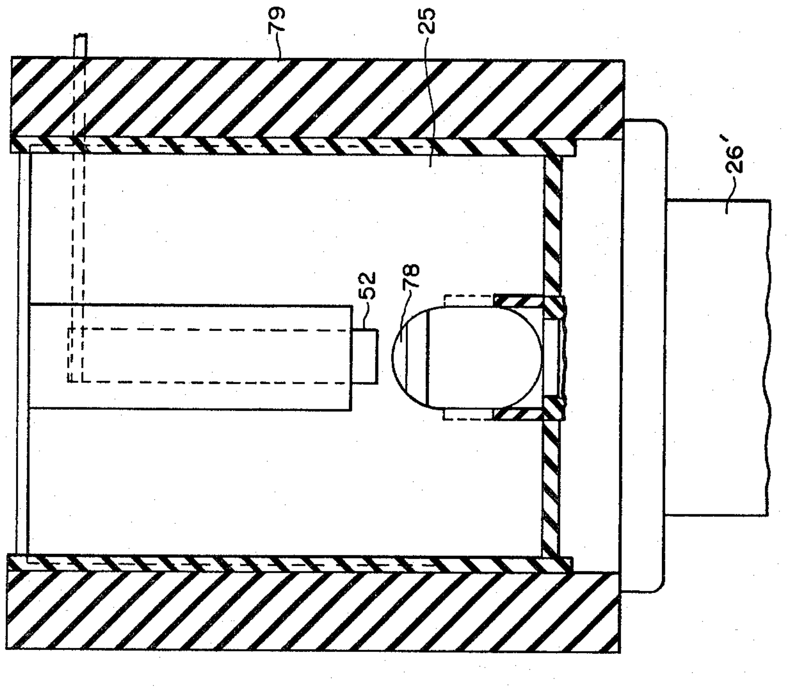
FIG. 7 is a view, in section, taken along the line VII—VII in FIG. 6.
Figure 6:
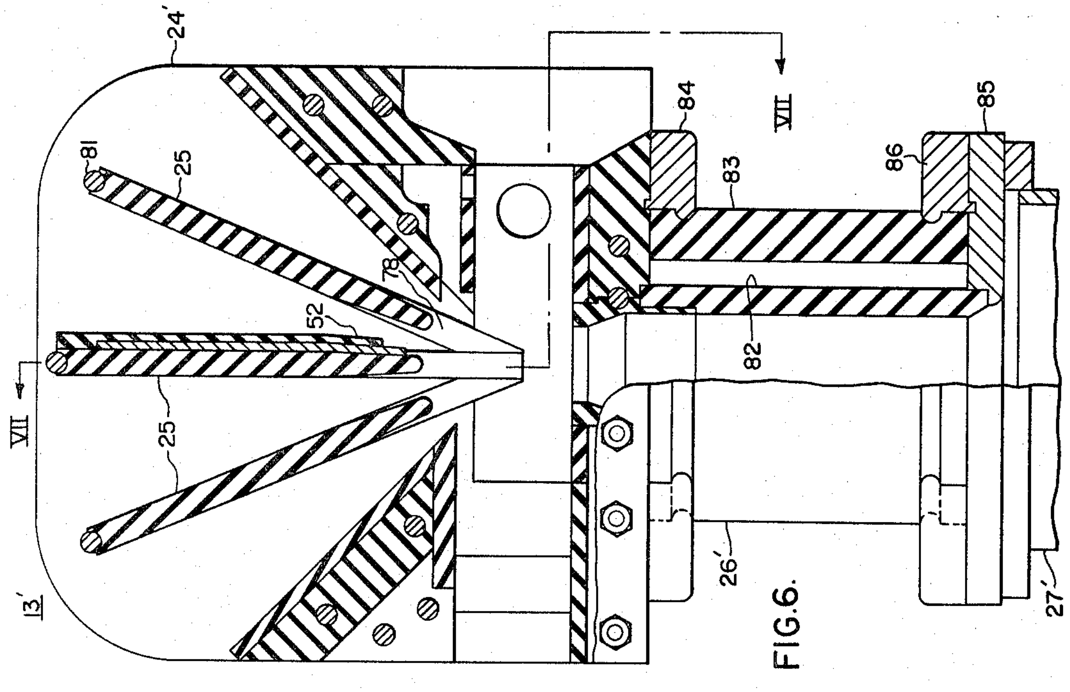
FIG. 6 is a view, in section, of the arc box and splitter assembly for the circuit breaker of FIG. 4.

The interrupter 13' is shown in FIGS. 6 and 7. As previously explained, the splitter plates 25 are preferably composed of "Teflon" and the arc box 24' is lined with "Teflon." Each splitter plate 25 has a slot 78 at its lower end for receiving the arc drawn between the contact members. The splitter plates are disposed between side plates 79 which are held against the splitter plates by bolts 81. The side plates 79 may be composed of a suitable insulating material.

The arc box 24' is supported by the insulating member 26' which in this case comprises an inner tube 82 and an outer tube 83. The inner tube 82 may be suitable for conducting gas and the outer tube 83 may be weather resistant. One tube may be utilized if desired. The arc box is attached to the insulating member 26' by a clamp 84. The insulating member 26' is attached to a flange 85 on the puffer cylinder 27' by a clamp 86.

Figure 10:
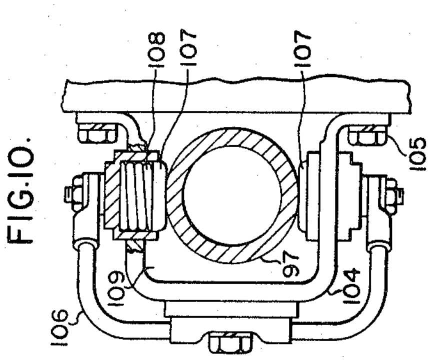
FIG. 10 is a view, in section, taken along the line X—X in FIG. 9.
Figure 9:
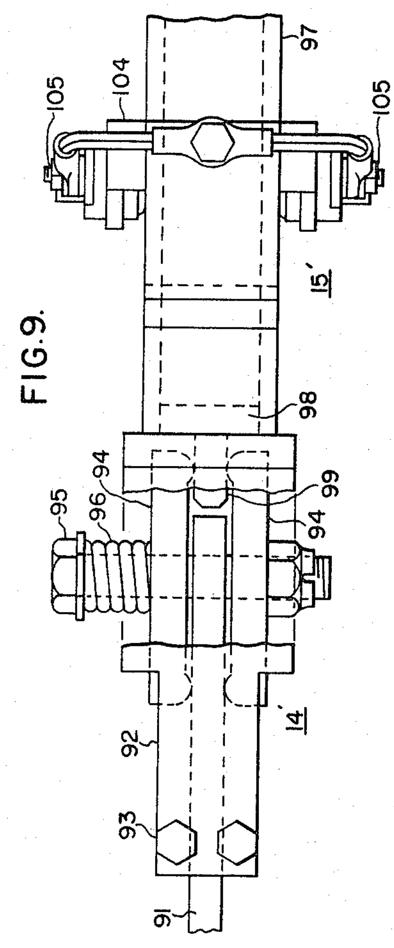
FIG. 9 is a view, in plan, of the contact assembly.
Figure 8:
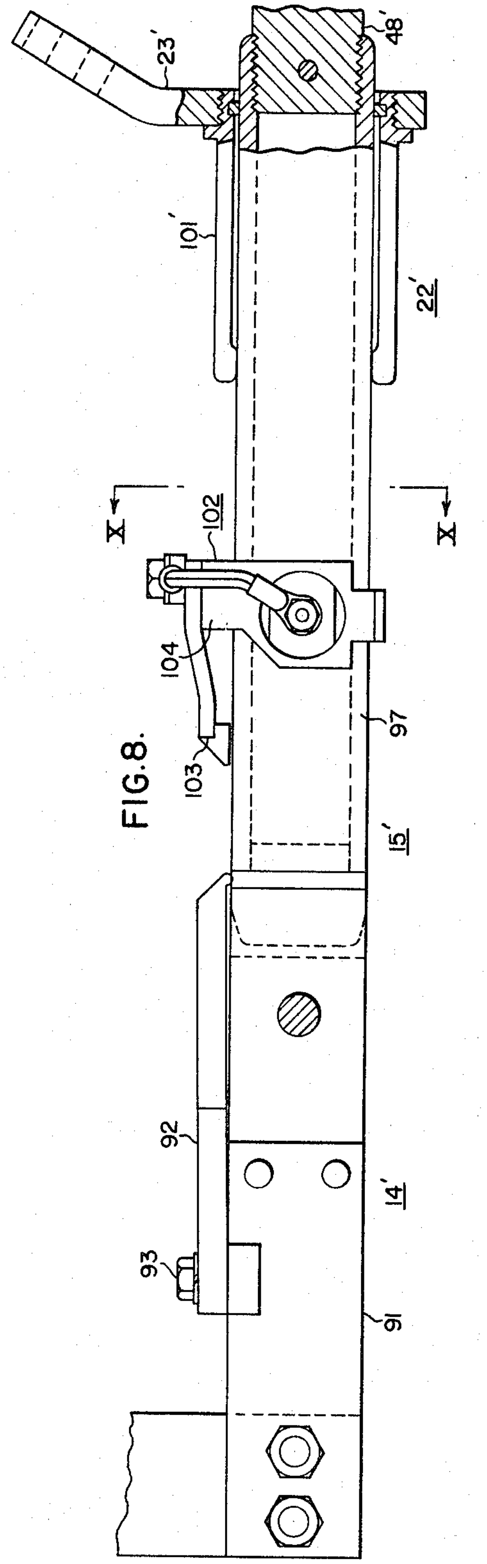
FIG. 8 is a view, in elevation, of the contact assembly for the circuit breaker.
Figure 11:
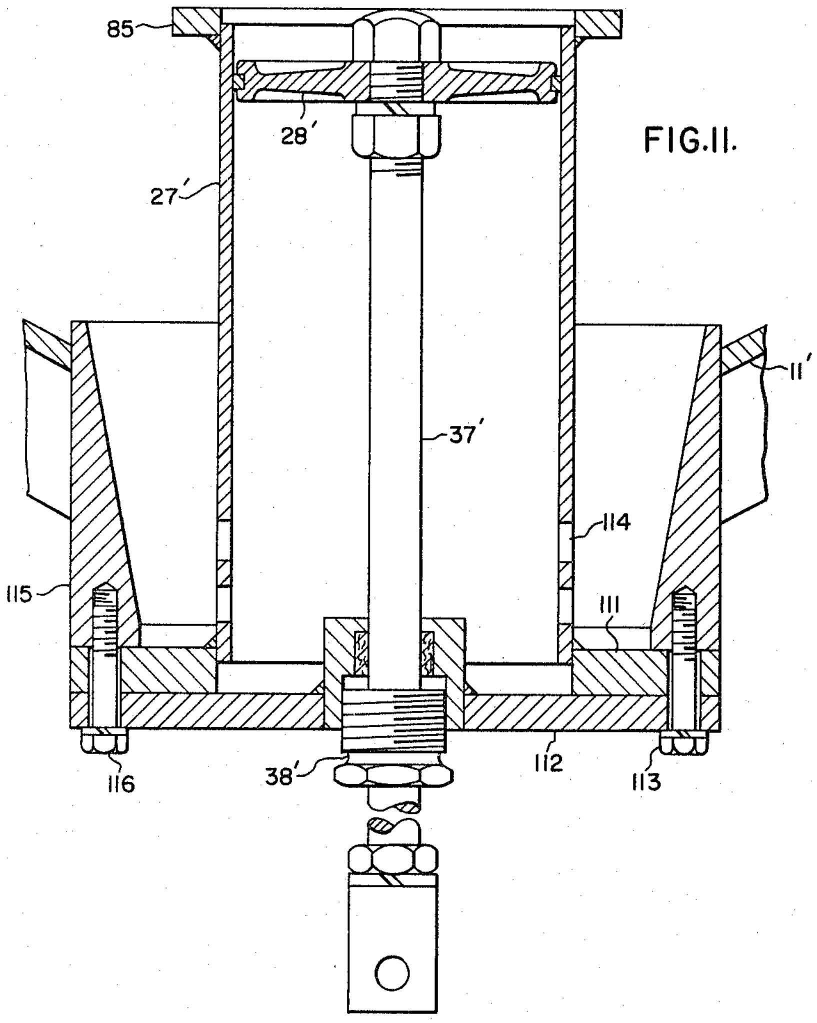
FIG. 11 is a view, partly in elevation and partly in section, of the puffer assembly for the breaker shown in FIG. 4.

The fixed contact member 14' and the movable contact member 15' are shown in FIGS. 8, 9 and 10. The fixed contact member 14' comprises a generally rectangular conductor 91 to the upper side of which an arm 92 is bolted by bolts 93. As shown most clearly in FIG. 9, contact fingers 94 are retained on opposite sides of the conductor 91 by a bolt 95 which extends through the fingers 94 and the conductor 91. A spring 96 which is disposed between the head of the bolt 95 and one of the fingers 94 permits limited movement of the fingers 94 relative to the conductor 91.

We claim as our invention:

1. A gas-blast circuit interrupter of the puffer type including, in combination:

(a) a metallic tank containing an interrupting gas under pressure above atmospheric pressure, (b) two insulating bushings extending through the upper wall of the tank, (c) a terminal conductor in each bushing, (d) an arc box inside said tank, (e) a plurality of spaced splitter plates in said arc box, (f) a fixed contact member at the bottom of the splitter plates, (g) a movable contact member engaging the fixed contact member, (h) each contact member being electrically connected to one of the terminal conductors, (i) puffer piston means disposed at the bottom of said tank including a stationary operating cylinder and a movable piston movable therein, (j) spring means disposed in said operating cylinder and acting on said piston in a fluid-driving direction, (k) a piston rod for operating said piston movable in said operating cylinder and extending externally of said piston means, (l) operating means for separating the contact members to draw an arc between them, (m) said operating means including linkage means externally of the tank and positively connected to the external end of said movable piston rod, (n) a resistor mounted on one of the bushings and having one terminal connected to the conductor in that bushing, (o) and probe means on one of the splitter plates for connecting the arc to another terminal of the resistor.

2. The gas-blast circuit interrupter of claim 1 in which the arc box is supported at the upper end of the stationary operating cylinder.

3. The gas-blast circuit interrupter of claim 1 in which a spring adjustment member 32 is adjustably attached to the stationary operating cylinder.

4. The gas-blast circuit interrupter of claim 1 in which the tank is grounded and one or more current transformers encircle at least one of the terminal bushings.

5. The gas-blast circuit interrupter of claim 1 in which the operating means includes an internally-disposed rotatable operating crank 47 secured to an operating shaft 46 and actuating the movable contact member.

References Cited

UNITED STATES PATENTS

| | | | |
|---|---|---|---|
| Re. 430 | 2/1944 | Paul | 200—148 |
| 2,102,768 | 12/1937 | Trencham et al. | 200—150 |
| 2,267,399 | 12/1941 | Farrer et al. | |
| 2,486,127 | 10/1949 | Davies | 200—148 |
| 2,757,261 | 7/1956 | Lingal et al. | 200—148 |
| 3,071,670 | 1/1963 | Yeckley et al. | 200—148 |

ROBERT S. MACON, *Primary Examiner.*